United States Patent [19]

Shahid

[11] Patent Number: 5,372,088
[45] Date of Patent: Dec. 13, 1994

[54] CRYSTAL GROWTH METHOD AND APPARATUS

[75] Inventor: Muhammed A. Shahid, Ewing Township, Mercer County, N.J.

[73] Assignee: AT&T Bell Laboratories, Murray Hill, N.J.

[21] Appl. No.: 814,654

[22] Filed: Dec. 30, 1991

[51] Int. Cl.$^5$ ............................................. C30B 11/14
[52] U.S. Cl. ................................................. 117/2
[58] Field of Search ............... 156/616.2, 616.3, 616.4, 156/616.41, 624, DIG. 98

[56] References Cited

U.S. PATENT DOCUMENTS

| | | | |
|---|---|---|---|
| 4,404,172 | 9/1983 | Gault | 422/248 |
| 4,946,542 | 8/1990 | Clemans | 156/DIG. 93 |
| 4,966,645 | 10/1990 | Shahid | 156/616.4 |
| 5,064,497 | 11/1991 | Clemans et al. | 156/616.4 |

OTHER PUBLICATIONS

"A Novel Application of the Vertical Gradient Freeze Method to the Growth of High Quality III-V Crystals," W. A. Gault et al., *Journal of Crystal Growth*, vol. 74, pp. 491-506, 1986.

"Elements of X-Ray Diffraction," B. B. Cullity, Addison-Wesley Publishing Company, Inc. 1956, pp. 55-60.

*Primary Examiner*—R. Bruce Breneman
*Assistant Examiner*—Felisa Garrett
*Attorney, Agent, or Firm*—Roderick B. Anderson

[57] ABSTRACT

In a VGF crystal growth method, the configuration of the outer periphery of the seed crystal (15) has the same dimensions as the configuration of the inner surface of the major portion of the crucible (12).

8 Claims, 1 Drawing Sheet

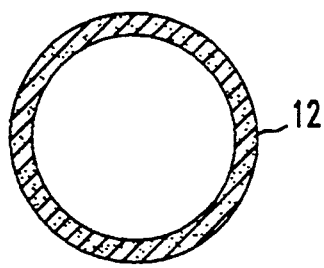
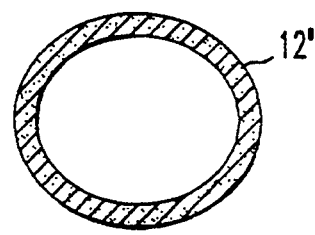
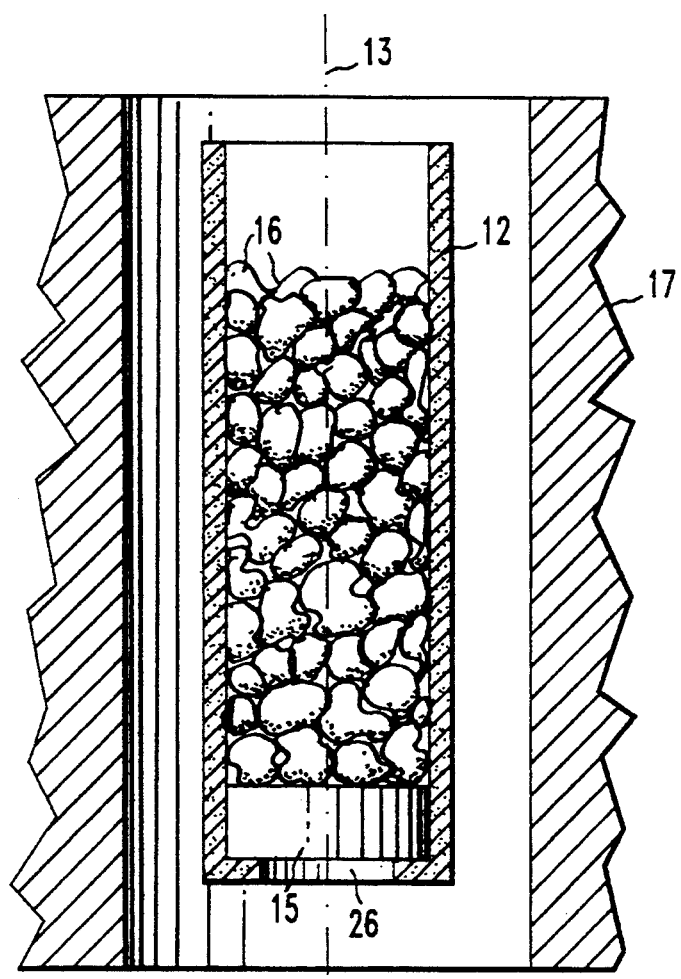
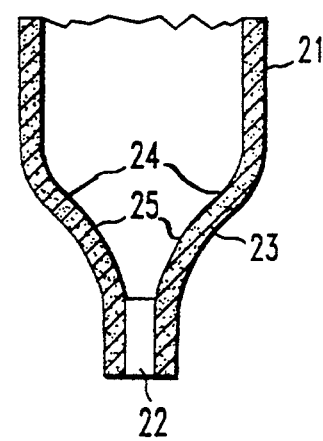

CRYSTAL GROWTH METHOD AND APPARATUS

TECHNICAL FIELD

This invention relates to processes for making ingots of single-crystal semiconductor material, and, more particularly, to methods and apparatus for growing group III–V rand group II–VI semiconductor monocrystalline ingots.

BACKGROUND OF THE INVENTION

Group III–V materials such as gallium arsenide and indium phosphide are used, for example, for making lasers, light emitting diodes, microwave oscillators, and light detectors. Group H–VI materials such as cadmium sulfide may also be used for making light detectors and other devices. Most commercial use of such compound semiconductors requires the growth of large single-crystal ingots from which wafers can be cut for the subsequent fabrication of useful devices. One of the more promising methods for such crystal growth is the vertical gradient freeze (VGF) method, particularly the VGF method described in the U.S. Pat. No. 4,404,172, of W. A. Gault, granted Sep. 13, 1983, and in the paper, "A Novel Application of the Vertical Gradient Freeze Method to the Growth of High Quality III–V Crystals," by W. A. Gault et al., *Journal of Crystal Growth*, Vol. 74, pp. 491–506, 1986, both of which are hereby corporated herein by reference.

According to the VGF method, raw semiconductor material is placed in a vertically extending crucible including a small cylindrical seed well portion at its bottom end which snugly contains a monocrystalline seed crystal. A frustoconical transition region connects the main portion of the crucible to the cylindrical seed well. Initially, the raw material and a portion of the seed crystal are melted. The power to the system is then reduced in such a manner that solidification or freezing proceeds vertically upwardly from the seed crystal, with the crystal structure of the grown ingot corresponding to that of the seed crystal.

While the VGF method seems to work better than other methods for reducing the density of imperfections in the finished ingot, the number of imperfections in such ingots still constitutes a problem. A particularly troublesome problem is known as "twinning" in which a fault in the crystal structure separates portions of the ingot having different crystal orientations. The prior art contains many references to the problem of twinning and to various methods for alleviating this problem. Nevertheless, there continues to be a long-felt need in the industry for methods for growing large single crystals of compound semiconductor material with fewer defects and imperfections and for growing such crystals reliably and at lower cost.

SUMMARY OF THE INVENTION

In accordance with the invention, a seed crystal is used which has substantially the same outer dimensions as the dimensions of the inner surface of the major portion of the crucible. That is, if the inner surface of the major portion of the crucible is a cylinder having a substantially constant diameter D, the seed crystal that is used likewise has a diameter D. The crucible therefore may be entirely cylindrical with no separate seed well portion or frustoconical transition region between the small seed well portion and the major portion of the crucible. I have found that the elimination of the frustoconical transition region reduces or eliminates a major source of twinning in the growth of monocrystalline ingots. The invention also simplifies and reduces the cost of crystal growth.

As will become clear later, the invention can be used in any of other various ways to produce other ingots having different shapes and configurations. These and other objects, features and benefits of the invention will be better understood from a consideration of the following detailed description taken in conjunction with the accompanying drawing.

BRIEF DESCRIPTION OF THE DRAWING

FIG. 1 is a schematic view of apparatus for making semiconductor crystalline ingots in accordance with an illustrative embodiment of the invention;

FIG. 2 is a schematic sectional view of the crucible of FIG. 1 in accordance with one embodiment of the invention:

FIG. 3 is a schematic sectional view of another crucible that may be used in the apparatus of FIG. 1 in accordance with another embodiment of the invention; and FIG. 4 is a view of part of a crucible in accordance with the prior art.

DETAILED DESCRIPTION

The aforementioned Gault patent and related prior art literature describe in detail the apparatus to be used and procedural steps to be followed in successfully growing monocrystalline III–V or II–VI semiconductor ingots in accordance with the vertical gradient freeze (VGF) method. For the sake of brevity, and for the purpose of emphasizing the improvements which constitute the present invention, such details will not be repeated, it being understood that the preferred method of implementing the invention is through the use of the VGF method.

Referring now to FIG. 1, in accordance with one embodiment of the invention, a vertically extending crucible 12 has a central axis 13. A cylindrical monocrystalline seed crystal 15 of the semiconductor material to be grown, such as indium phosphide, is placed at the bottom of the crucible. The crucible is then nearly filled with raw material from which the ingot is to be made, such as polycrystals 16 of indium phosphide. There may also be included in the crucible a quantity of boric oxide for encapsulating the molten II–V material, and there may also be included elemental group V material for maintaining stoichiometry of the ingot during its growth, as is known in the art. In accordance with the invention, as illustrated further in FIG. 2, the crucible 12 is substantially cylindrical in shape and the seed crystal 15 is cylindrical and has an outer periphery having the same diameter as the inner diameter of the crucible.

Heat is controllably applied to the raw material by a heater 17 which surrounds the crucible 12. All of the raw material 17 and an upper portion of the seed crystal 15 are melted and then the power to the heater is reduced to give a predetermined temperature gradient within the crucible that causes recrystallization or freezing, first at the interface of the melt and the seed crystal. The solidification progresses upwardly until the entirety of the molten raw material has been recrystallized into an ingot. If the process is executed with perfection, the ingot will be of a single crystal having a crystal orientation identical to that of the seed crystal 15. During melting and subsequent solidification of the semiconductor material, an over-pressure of gas, which may or may not include vapors of the group V element material, may be applied to the upper surface of the melt to retard the escape of vaporized group V material from the melt. For making two inch wafers, the seed crystal 15 may have an axial length of 0.5 inch which is melted back about 0.25 inch during the melting step.

As pointed out in the U.S. Pat. No. 5,064,497, of Clemans et al., granted Nov. 12, 1991, if the upper surface of seed crystal 15 lies in the {100} plane, the ingot will grow in the <100> direction and wafers may advantageously be sliced from the ingot by cutting in a direction normal to the central axis of the ingot. Such growth, however, causes a strain between the solidifying ingot and the crucible which may be relieved in accordance with the Clemans et al. patent by including along the outer surface of the crucible a material that can react with the crucible during ingot growth. Such reaction will cause the crucible to fracture in response to stresses, thereby absorbing the stresses rather than allowing them to fracture the ingot.

As pointed out in the U.S. Pat. No. 4,966,645, of Shahid, granted Oct. 30, 1990, the upper surface of the seed crystal 15 may alternatively be located in the {111} plane such that growth is in the <111> direction, which reduces stresses during growth. However, since it is desirable that the upper surface of the final wafer be in the {100} plane, the ingot should then be sliced at an angle with respect to the central axis. Referring to FIG. 3, one may use as a crucible a crucible 12' having an elliptical cross-section. When such a crucible is used, the final ingot will have an elliptical cross-section, and if the ingot is sliced at a proper angle in the direction of the minor axis of the ellipse, it will yield circular wafers as described in the Shahid patent. If a double walled crucible is used as described in the Clemans et al. patent, it is preferred that the crucible be made of glass, since it cannot be reused, whereas the Shahid patent points out that for a reusable crucible the preferred crucible material is pyrolytic boron nitride.

All of the prior art VGF methods with which I am aware, including those mentioned above, use a crucible as shown in FIG. 4 having a large diameter major portion 21, a small diameter seed well portion 22, and a frustoconical portion 23 interconnecting the seed well portion with the major portion. In my study of the prior art method of making monocrystalline ingots, I found that "twins" tend to be nucleated at points, such as points 24 and 25, where the direction of curvature of the crucible changes. The problem of twinned crystals is discussed, for example, in "Elements of X-Ray Diffraction" by B. B. Cullity, *Addison-Wesley Publishing Company, Inc.,* 1956, pp. 55–60. By eliminating the frustoconical portion and eliminating changes in direction of the curvature of the inner surface of the crucible, my method significantly reduces the incidence of fault nucleation with consequent formation of unwanted twins.

I have further found that the crucible 12 shown in FIG. 1 is easier to make and therefore less expensive than prior art crucibles. This is particularly true where the crucible must have an elliptical cross-section as shown in FIG. 3. It has proven very difficult to fabricate an appropriate transition region between an elliptical major portion 21 of a crucible and a smaller seed well portion 22 as shown on FIG. 4.

Referring again to FIG. 1, the crucible 12 preferably has an opening 26 at the bottom which permits the operator to push the solidified ingot out of the crucible after completion of the VGF process. As a further aid to removing the ingot, as is known in the art, the major portion of the crucible may have a slightly flared configuration; that is, its inner diameter at the top may be slightly larger than its inner diameter at the bottom. With this in mind, I consider the invention to lie in the use of a crucible having a substantially constant inner diameter along its entire length, with the seed crystal 15 having an outer diameter which is substantially equal to that inner diameter, it being understood that the crucible may have a slight flare in the direction of the top of the crucible.

Various embodiments and modifications other than those expressly described may be made by those skilled in the art without departing from the spirit and scope of the invention.

I claim:

1. A method for making an ingot of a semiconductor material comprising the steps of:
   putting a monocrystalline seed semiconductor crystal at the bottom of a crucible having a substantially vertically extending central axis;
   including over the seed crystal semiconductor raw material;
   heating the crucible to melt the semiconductor raw material and part of the seed crystal;
   cooling the crucible in such a manner as to solidify the semiconductor material to form a crystalline ingot having an outer surface that conforms to the inner surface of the crucible;
   the invention being characterized in that the seed crystal has an area in a section taken transversely to the central axis which is substantially equal to the area enclosed by the crucible in a section taken transversely to the central axis along a major portion of the length of the crucible.

2. The method of claim 1 wherein:
   the areas enclosed by the crucible in sections taken transversely to the vertical central axis are substantially equal along the entire length of the crucible.

3. The method of claim 2 wherein:
   the volume enclosed by the crucible is substantially in the shape of a cylinder and the seed crystal is in the shape of a cylinder having an outer diameter substantially equal to the inner diameter of the crucible.

4. The method of claim 2 wherein:
   the area enclosed by the crucible in a section taken transversely to the vertical central axis has an elliptical configuration;
   and the outer periphery of the seed crystal has substantially the same elliptical configuration as said area enclosed by the crucible.

5. The method of claim 1 wherein:
   the step of cooling the crucible comprises the step of progressively solidifying the molten material in an upward direction from the seed crystal to form an ingot having a central axis coincident with the central axis of the crucible.

6. The method of claim 5 wherein
   the semiconductor seed crystal and the semiconductor raw material are both semiconductors taken from the group consisting of a group III–V semiconductor material and a group II–VI semiconductor material.

7. The method of claim 6 wherein:
   the recited steps comprise part of a VGF method for growing an ingot.

8. The method of claim 2 wherein:
   the inner surface of the crucible flares slightly from its bottom toward its top.

* * * * *